(12) United States Patent
Shah et al.

(10) Patent No.: US 11,507,042 B2
(45) Date of Patent: Nov. 22, 2022

(54) HIGH CURRENT AND POWER LIMITING CIRCUIT FOR I/O MODULES WITH INTERNAL OUTPUT POWER SUPPORT

(71) Applicant: Rockwell Automation Asia Pacific Business Centre Pte. Ltd., Singapore (SG)

(72) Inventors: Rajesh R. Shah, Singapore (SG); Michael C. Tumabcao, Philippines (PH)

(73) Assignee: Rockwell Automation Asia Pacific Business Centre PTE. Ltd., Singapore (SG)

( * ) Notice: Subject to any disclaimer, the term of this patent is extended or adjusted under 35 U.S.C. 154(b) by 562 days.

(21) Appl. No.: 16/550,867

(22) Filed: Aug. 26, 2019

(65) Prior Publication Data

US 2021/0063988 A1    Mar. 4, 2021

(51) Int. Cl.
*G05B 19/042* (2006.01)
*G01R 19/25* (2006.01)

(52) U.S. Cl.
CPC ..... *G05B 19/0428* (2013.01); *G01R 19/2506* (2013.01); *G05B 19/0423* (2013.01); *G05B 2219/25342* (2013.01)

(58) Field of Classification Search
None
See application file for complete search history.

(56) References Cited

U.S. PATENT DOCUMENTS

| 5,355,077 | A | * | 10/1994 | Kates | G05F 1/565 323/283 |
| 6,037,857 | A | * | 3/2000 | Behrens | G05B 19/0425 340/12.34 |
| 6,288,883 | B1 | * | 9/2001 | Chen | H04M 3/18 361/58 |

(Continued)

FOREIGN PATENT DOCUMENTS

| CN | 101976951 A | * | 2/2011 | ............... H01R 9/00 |
| DE | 102016117936 B4 | * | 12/2020 | ............... H02M 1/12 |

(Continued)

OTHER PUBLICATIONS

Extended European Search Report dated Jan. 29, 2021; Application No./Patent No. 20186723.1-1202—(9) pages.

*Primary Examiner* — Thomas J. Hiltunen
*Assistant Examiner* — Khareem E Almo
(74) *Attorney, Agent, or Firm* — Boyle Fredrickson, SC

(57) ABSTRACT

An output module for an industrial controller provides electrical isolation between each of the output terminals in the module. The output module receives control signals from the industrial controller indicating a desired output state for each of the output terminals and selectively connects power from the output of the electrical isolation to the output terminal. During normal operation, a switching device connects the power to the output terminal responsive to the control signal. A current sensor monitors the current conducted at the output terminal. If the current exceeds a predefined threshold, a current limit circuit clamps the current being output at the terminal. A control circuit may (Continued)

allow the output terminal to ride through a temporary spike in current or disable the output terminal if a fault condition is detected.

19 Claims, 3 Drawing Sheets

(56) References Cited

U.S. PATENT DOCUMENTS

| | | | | |
|---|---|---|---|---|
| 6,396,137 | B1 * | 5/2002 | Klughart | H02M 3/003 |
| | | | | 257/691 |
| 6,763,109 | B1 | 7/2004 | Hoskins | |
| RE39,065 | E * | 4/2006 | Nelson | H02M 3/33507 |
| | | | | 323/284 |
| 10,579,027 | B2 * | 3/2020 | KN | G05B 15/02 |
| 2011/0193539 | A1 * | 8/2011 | Schmidt | H02M 3/156 |
| | | | | 323/282 |
| 2015/0188415 | A1 * | 7/2015 | Abido | G05B 13/04 |
| | | | | 307/103 |
| 2019/0056708 | A1 * | 2/2019 | Kumar KN | G06F 13/4072 |
| 2021/0408840 | A1 * | 12/2021 | Peralta | H02J 50/12 |

FOREIGN PATENT DOCUMENTS

| | | | | |
|---|---|---|---|---|
| EP | | 0883044 A2 | 12/1998 | |
| WO | WO-2014011685 A1 * | | 1/2014 | H02M 1/36 |

\* cited by examiner

HIGH CURRENT AND POWER LIMITING CIRCUIT FOR I/O MODULES WITH INTERNAL OUTPUT POWER SUPPORT

BACKGROUND INFORMATION

The subject matter disclosed herein relates to the field of industrial automation, and more specifically, to a high current and power limiting circuit for use in an output module for an industrial controller.

Industrial controllers are specialized computer systems used for the control of industrial processes or machinery, for example, in a factory environment. Generally, an industrial controller executes a stored control program that reads inputs from a variety of sensors associated with the controlled process and machine and, sensing the conditions of the process or machine and based on those inputs and a stored control program, calculates a set of outputs used to control actuators controlling the process or machine.

Industrial controllers differ from conventional computers in a number of ways. Physically, they are constructed to be substantially more robust against shock and damage and to better resist external contaminants and extreme environmental conditions than conventional computers. The processors and operating systems are optimized for real-time control and are programmed with languages designed to permit rapid development of control programs tailored to a constantly varying set of machine control or process control applications.

Generally, the controllers have a highly modular architecture, for example, that allows different numbers and types of input and output modules to be used to connect the controller to the process or machinery to be controlled. As part of their enhanced modularity, industrial controllers may employ input and output modules or various other modules and devices dedicated to a particular type of electrical signal and function, for example, detecting AC or DC input signals or controlling AC or DC output signals. Each of these modules may have a connector system allowing them to be installed in different combinations in a housing or rack along with other selected modules or devices to match the demands of the particular application. Multiple or individual modules or devices may be located at convenient control points near the controlled process or machine to communicate with a central industrial controller via the control network.

Output modules provide an interface between a program executing on the industrial controller and the industrial equipment or devices which the program is intended to control. Instructions in the program may determine, for example, when an actuator is to turn on or off, when a relay is to open or close, or when a motor is to start or stop. The digital signal within the industrial controller is provided to the output module. The output module receives power for the output terminals from an external power source and selectively connects the power to individual output terminals according to the digital signals received from the control program in order to control operation of the external device.

As is known to those skilled in the art, the signal from the industrial controller is typically provided as a digital signal. The digital signal may be a logical zero and be at a ground, or common potential, for example, of zero volts (0 VDC) or the digital signal may be a logical one and be at a high reference voltage, such as 3.3 VDC or 5 VDC. The logical voltage reference, however, is commonly a different voltage than the desired output voltage at the terminal. The desired output voltage may be +/−12 VDC, +/−24 VDC, +/−48 VDC, or the like. Further, the total current requirements for all of the controlled devices connected to one output module typically exceeds the power capacity of the power supply provided for the logical circuit components. Thus, a separate power supply is often provided with one terminal of the output module configured to receive power from the power supply at the desired output voltage, where the power supply has a sufficient power rating to supply current to each controlled device at the desired output voltage. This power is selectively connected to individual output terminals by a switch where the switch for each output terminal is controlled responsive to the digital signal received for the corresponding output terminal.

Providing an external power supply to the output module to drive each of the external devices connected to that output module is not without certain drawbacks. A parallel circuit is established internally to the output module between the input terminal connected to the external power supply and each of the output terminals. Although the switch may selectively connect each output terminal to the power supply, when multiple switches are enabled and driving multiple output terminals in tandem, a conductive path is established between each of the driven output terminals. Under normal operation, this parallel operation is acceptable. If, however, one terminal experiences a high current due, for example, to an inrush current when an inductive load closes or to a short circuit condition, each of the output terminals being driven in tandem are connected to the circuit in which the high current is being conducted. A potential exists, for damage to other devices being controlled in tandem with the output terminal on which the high current is being conducted.

Thus, it would be desirable to provide an output module having multiple output terminals with electrical isolation between each of the terminals.

BRIEF DESCRIPTION

The subject matter disclosed herein describes an output module for an industrial controller having multiple output terminals with electrical isolation between each of the terminals. The output module receives control signals via an internal bus, where the control signals indicate a desired output state for each of the output terminals. An external power supply is connected to the output module to supply power for each of the output terminals. Switching circuitry within the output module selectively connects the external power supply to the output terminals responsive to the control signals.

Electrical isolation is provided between each of the output terminals in order to prevent a spike in current at one terminal from adversely impacting devices connected at any of the other terminals. According to one aspect of the invention, the electrical isolation is provided by a transformer connected between the external power supply and each output terminal. A control circuit for each output terminal receives power from the isolated side of the transformer and controls a switch connected between the isolated side of the transformer and the output terminal to selectively connect the output of the transformer to the output terminal.

If a fault condition, switching condition, or other event occurs at the output terminal resulting in a current spike being drawn from the output terminal, the spike may cause the transformer to enter a shut-down mode in which it is unable to maintain the power supplied to the output terminal. In this shut-down mode, the voltage supplied from the transformer may drop such that it causes the control circuit to shut down. Shut down of the control circuit may result in an unintended disabling of the output terminal, and unintended shut down of the control circuitry may create an unsafe operating condition in a safety module or reduce availability of a fault tolerant module. Additionally, when the control circuit shuts down, the connection between the transformer and the output terminal may be broken, removing the current draw from the transformer. As the transformer exits the shut-down mode and the voltage level returns to a normal operating level, the control circuit is re-enabled and the terminal may be reconnected to the transformer. Reconnection of the output terminal to the transformer may re-establish a connection under the fault condition or cause another outrush spike of current to a load device at the terminal. Repeating this sequence may also result in high-frequency oscillations of current at the output terminal.

A current limiting circuit is provided between the isolated side of the transformer and the output terminal to prevent the voltage level output from the transformer from dropping enough to disable the control circuit. As a result, the control circuit remains on during periods of high current draw at an output terminal and may maintain the connection between the transformer and the output terminal, if desired. The control circuit may further be used to monitor the current flow output at each terminal and to generate a signal indicating a short circuit condition for reporting back to the industrial controller in which the output module is mounted.

According to one embodiment of the invention, an output circuit for an output module used in an industrial controller is disclosed. The output module includes multiple output terminals, and the output circuit includes a system side control circuit operative to receive multiple digital signals from the industrial controller, where each of the digital signals corresponds to a desired output signal at one of the terminals. For each of the output terminals, the output circuit further includes an isolation circuit, a terminal control circuit, and a current limit circuit. The isolation circuit includes an input configured to receive power from a power source and an output configured to provide power electrically isolated from the power source to the corresponding output terminal. The terminal control circuit is operative to receive power from the output of the isolation circuit, receive the digital signal for the corresponding output terminal, and selectively connect the output of the isolation circuit to the corresponding output terminal. The current limit circuit is operative to limit a current conducted between the output of the isolation circuit and the corresponding terminal to a predefined threshold.

According to another embodiment of the invention, an output circuit for an output module used in an industrial controller is disclosed. The output module includes multiple output terminals, and the output circuit includes multiple isolation circuits. Each isolation circuit corresponds to one of the output terminals and each isolation circuit is configured to receive power from a power source at an input to the isolation circuit and to provide electrically isolated power from an output of the isolation circuit to the corresponding output terminal. The output circuit also includes multiple terminal control circuits and multiple current limit circuits. Each terminal control circuit corresponds to one of the output terminals and is operative to selectively connect the electrically isolated power from the corresponding isolation circuit to the corresponding output terminal. Each current limit circuit corresponds to one of the output terminals and is operative to limit a current conducted between the output of the isolation circuit and the corresponding terminal to a predefined threshold.

According to still another embodiment of the invention, a method of limiting current in an output module used in an industrial controller is disclosed, where the output module includes multiple output terminals. A digital input signal is received for each of the output terminals. Each digital input signal defines a desired output state of the corresponding output terminal. Power is received from a power source at an input for multiple electrical isolation devices, where each electrical isolation device corresponds to one of the output terminals. Power is selectively supplied from an output of each of the electrical isolation devices to the corresponding output terminal. A switching device in a terminal control circuit receives the electrically isolated power from the output of the electrical isolation device and selectively supplies the power to the corresponding output terminal responsive to the corresponding digital input signal. A current present at each of the plurality of output terminals is monitored, and the current conducted between the output of the isolation circuit and the corresponding terminal is limited to a predefined threshold with a current limit circuit.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
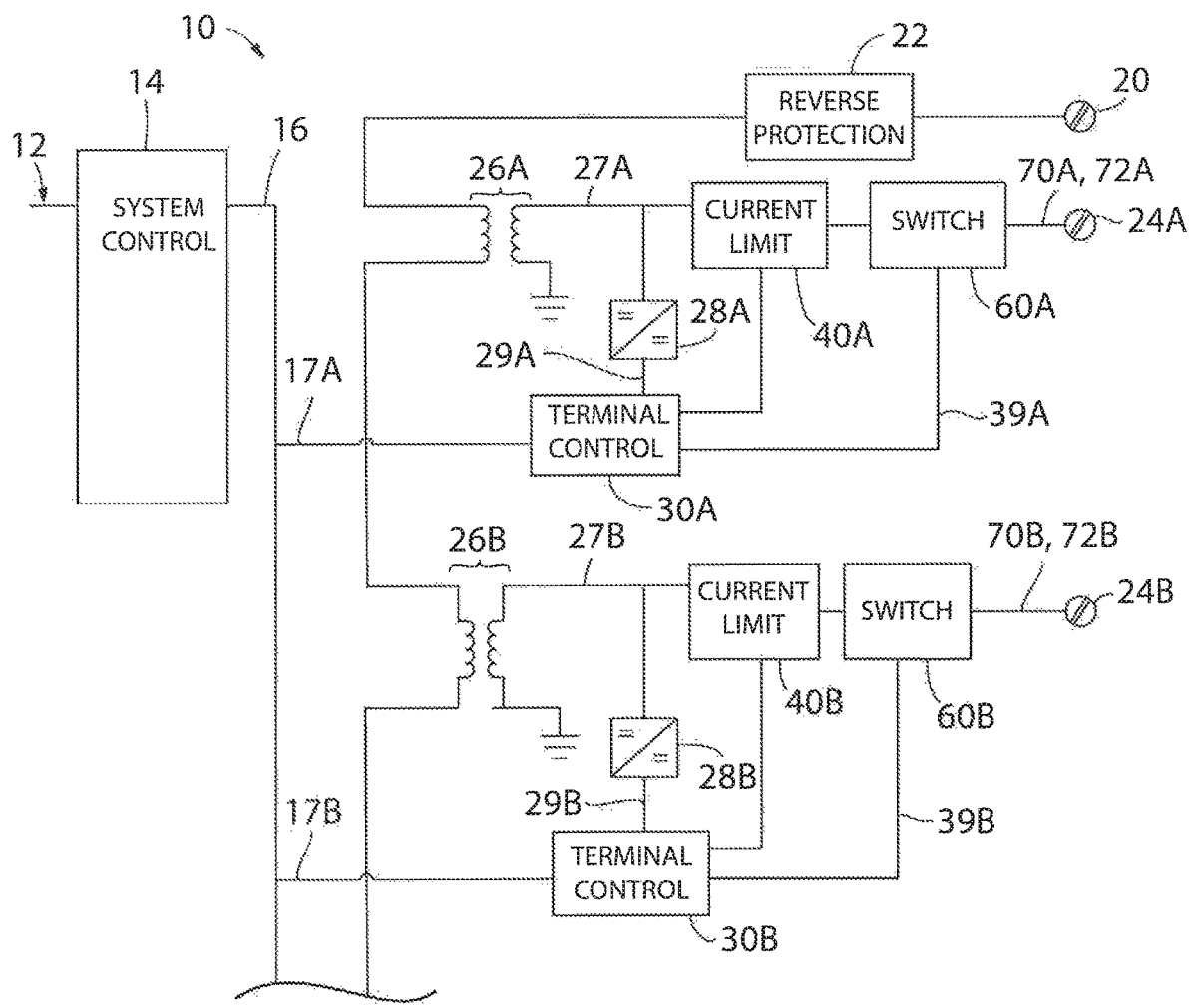
FIG. 1 is a schematic representation of a circuit to limit high current output at terminals of an output module for an industrial controller according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Turning initially to FIG. 1, an output circuit 10 for an output module used in an industrial controller includes multiple sub-circuits. According to the illustrated embodiment, the output circuit 10 includes a system control circuit 14 and a reverse protection circuit 22. For each output terminal 24, the output circuit 10 further includes an electrical isolation circuit 26, a terminal control circuit 30, a current limit circuit 40, and a switching circuit 60. The output circuit 10 is divided into the sub-circuits for ease of illustration and discussion, and the illustrated embodiment is not intended to be limiting. The illustrated embodiment is one embodiment of the invention and it is contemplated that various elements discussed with respect to one sub-circuit may be incorporated into another sub-circuit to achieve an identical function without deviating from the scope of the invention.

The illustrated system control circuit 14 provides an interface between the industrial controller and the output module. The system control circuit 14 may include, for example, a backplane connector operative to connect to a backplane such that the system control circuit 14 may receive digital signals 12 from a processor module or from other modules within the industrial controller. The processor module (not shown) may execute a control program to generate desired operation of devices controlled by the industrial controller. The control program generates digital signals 12 which are transmitted to the output module via the backplane and received by the system control circuit 14.

The digital signals 12 may be passed to the output module in various forms. Discrete signals may be passed over dedicated channels on a data bus. Optionally, the data signals 12 may be included in a data packet and transmitted via the data packet over the backplane to the output module. The system control circuit 14 may include, for example, buffers to receive the data packets and a processor executing instructions to receive the data packet and extract the data signals. Optionally, the processor may perform some further processing on the data signals 12 prior to using the data signals to enable/disable individual output terminals 24 on the output module.

A data bus 16 is provided as an output from the system control circuit 14 to each of the output terminals 24. Appropriate interface circuitry may be provided within a terminal control circuit 30 for each output terminal to extract control signals 17 from the bus 16. Optionally, the bus 16 may consist of multiple individual traces on which each control signal 17 is separately conducted from the system control circuit 14 to the corresponding terminal control circuit 30 for each output terminal. For ease of illustration, two output terminals 24A, 24B, with associated control circuitry for each output terminal, are illustrated in FIG. 1. It is contemplated that the output module may include a single output terminal 24 or may include still additional output terminals beyond the two illustrated terminals 24. Output modules may be configured, for example, with eight (8) or sixteen (16) output terminals 24, where the control circuitry for one output terminal is duplicated for each output terminal in the module.

Figure 2:
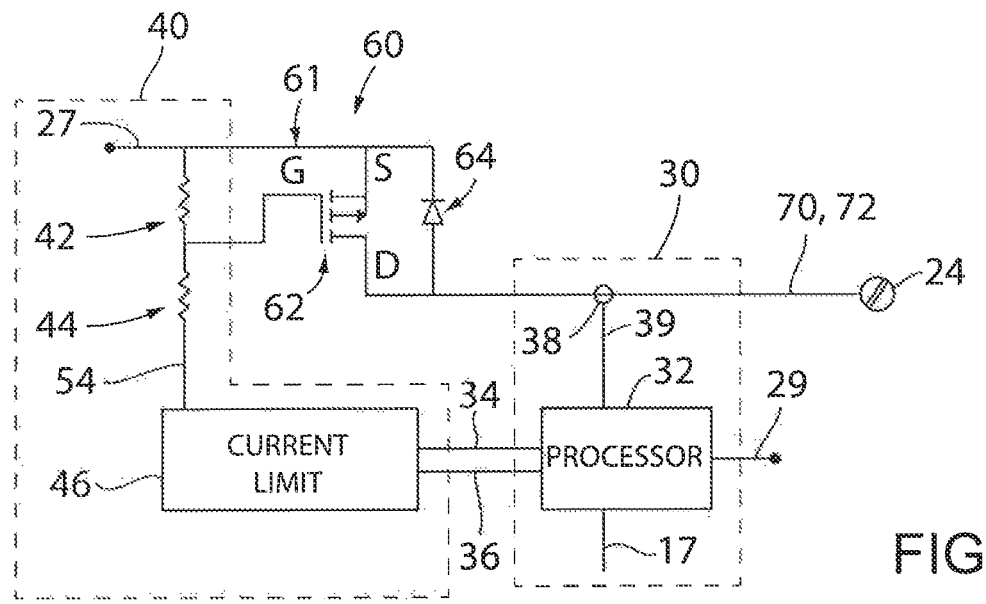
FIG. 2 is a partial schematic representation of the circuit of FIG. 1 for a single output terminal.

With reference also to FIG. 2, the terminal control circuit 30 for each output terminal 24 may include a microprocessor 32. The microprocessor 32 is powered by a control voltage 29 received as an output from the isolation circuit 26. The microprocessor 32 receives the control signal 17 as an input to indicate when the corresponding output terminal 24 is to be energized. A pair of outputs 34, 36 are provided to the current limit circuit 46, where a first output 34 indicates that the output terminal 24 is to be energized and a second output 36 indicates that the output terminal is to operate in a current limiting state. According to one embodiment of the invention, the control signal 17 and the control voltage 29 are the same signal. The system control circuit 14 may output the control signal 17 as an enabling voltage to the microprocessor 32. The enabling voltage may both energize the microprocessor and indicate that the output terminal 24 is to be energized. When used as an enabling voltage and as a control signal 17, the control voltage 29 may also be provided to the current limit circuit 46 as the first output signal 34, indicating that the output terminal is to be energized.

A current sensor 38 is provided to generate a current feedback signal 39 corresponding to the current being conducted at the output terminal 24, As illustrated in FIG. 2, the current sensor 38 is incorporated in the terminal control circuit 30. As illustrated in FIG. 1, the current sensor 38 (although not shown in FIG. 1)) is incorporated in the switch circuit 60 and provides the current feedback signal 39 to the terminal control circuit 30. The current sensor 38 may be, for example, a current sensing resistor connected in series with the output terminal 24. A voltage drop across the current sensing resistor may be measured and provided as the current feedback signal 39 which is input to the microprocessor 32.

It is contemplated that the microprocessor 32 may be configured to receive the control signal 17 and the current feedback signal 39 as input signals, to execute stored instructions, and to generate the output signal(s) 34, 36 responsive to the input signals. Optionally, the microprocessor may be a dedicated integrated circuit (IC) performing a single function, such as a comparison function, where the current feedback signal 39 is compared to a threshold and the second output signal 36 is generated when the current conducted at the output terminal 24 exceeds the threshold. According to still another embodiment of the invention, the microprocessor 32 may be a field programmable gate array (FPGA) or an application specific integrated circuit (ASIC) configured to generate the output signal(s) 34, 36 responsive to the measured current feedback signal 39 and control signal 17. A single IC may be provided for each output terminal 24 or one IC may incorporate multiple control circuits 30 to control operation of multiple output terminals 24.

Figure 3:
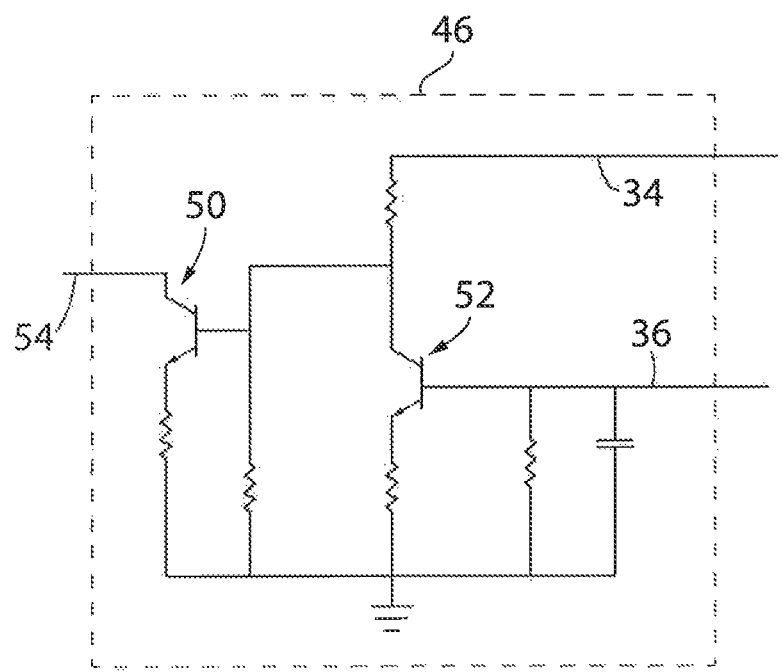
FIG. 3 is a schematic representation of one embodiment of the current limit circuit of FIG. 1.

With reference also to FIG. 3, the current limit circuit 46 is used, in combination with the control circuit 30 to control operation of the switching circuit 60, The switching circuit 60 includes a field-effect transistor (FET) 62, such as a metal-oxide-semiconductor field-effect transistor (MOSFET). The FET 62 is controlled in one of three operating states to determine the output of the corresponding output terminal 24. In a first operating state, the FET 62 is disabled, preventing current conduction through the device and turning off the output terminal 24. In a second operating state, the FET 62 is enabled, or operating, in a saturation mode, allowing "full" conduction through the FET and turning on the output terminal 24. The first two operating states are considered the "normal" operating states for each output circuit. A third operating state is also provided for a "current limiting" operating state. The FET 62 is operated in a linear mode, where the voltage supplied to the gate is varied such that the FET operates as a variable resistor to vary the amount of current conducted through the FET.

In operation, the current limit circuit 46 outputs a switching signal 54 to the switching circuit 60 to select the desired operating mode of the FET 62 and, thereby limit the current output from the output terminal 24. When the control signal 17 indicates the corresponding output terminal 24 is to be turned off, the control circuit 30 and the current limit circuit 46 operate in tandem to disable the FET 62 and operate in the first operating mode. When the control signal 17 indicates the corresponding output terminal 24 is to be turned on, the control circuit 30 and the current limit circuit 46 operate in tandem to supply a first voltage to the gate terminal of the FET, causing the FET to operate in the saturation mode. If the control circuit 30 detects a signal from the current sensor 38 indicating the current at the output terminal 24 exceeds a predefined threshold, the control circuit 30 and current limit circuit 46 operate in tandem to supply a second voltage to the gate terminal of the FET, causing the FET to operate in a linear mode, restricting the amount of current output from the terminal.

Power to drive external devices connected to each output terminal 24 is supplied to the output module by an external power source. The external power source may be a power supply providing, for example, 12 VDC, 24 VDC, 48 VDC or any other suitable voltage level which is connected to a first terminal 20 of the output module. This first terminal 20 is also referred to herein as a power supply terminal. The power source is configured to have a sufficient power rating to supply current at the desired output voltage for each of the output terminals 24 in the output module to which it is connected. A reverse protection circuit 22 may be provided to prevent damage to the output module if the external power source is erroneously connected to the output module with a reverse polarity.

Although the power for each output terminal 24 is provided from a single power source, the output module includes electrical isolation provided between output terminals to prevent a fault condition at one terminal from damaging devices connected at other terminals. An electrical isolation device 26 is provided for each output terminal between the power supply terminal 20 and the circuitry to control operation of the corresponding output terminal 24. According to the embodiment in FIG. 1 a first output terminal 24A includes a first isolation transformer 26A, and a second output terminal 24B includes a second isolation transformer 26B. Each isolation transformer 26 includes a primary winding electrically connected to the power supply terminal 20 and a secondary winding at which a control voltage 27, which is electrically isolated from the power supply voltage, is provided. A DC-to-DC power converter 28 receives the control voltage 27 as an input and outputs one or more DC voltages, such as 5 VDC, 3.3 VDC, or the like, suitable to supply power to ICs, processors, or other electrical devices within the control circuit 30 for the corresponding output terminal 24.

With the DC voltage from the output of the DC-to-DC power converter 28 enabling each control circuit 30A, 30B, the control circuit monitors the digital signal 17A, 17B received from the system control circuit 14 to set the respective output terminal 24A, 24B to the desired state as indicated by the digital signal. When the digital signal 17 is off, or set to a logical zero, both the first output 34 and the second output 36 from the control circuit 30 are off. As illustrated in FIGS. 2 and 3, the first output 34 from the control circuit is used to enable the first transistor 50 in the current limit circuit, and the second output 36 from the control circuit is used to enable the second transistor 52 in the current limit circuit 46. Thus, when both the first and second outputs are off, the first transistor 50 and the second transistor 52 in the current limit circuit are similarly disabled. The output 54 of the current limit circuit is similarly off, which disables the FET 62 in the switching circuit 60. When the digital signal 17 is on, or set to a logical one, the first output 34 from the control circuit is similarly on, or set to a logical one, which enables the first transistor 50 in the current limit circuit. The output 54 of the current limit circuit is set to a first voltage, which causes the FET 62 to enter the saturation mode. As previously indicated, the first output 34 may also be tied directly to the digital signal 17 such that the digital signal 17 is used both to enable the control circuit 30 and to enable the first transistor 50 in the current limit circuit 46, thereby enabling the FET.

The control circuit 30 monitors the current feedback signal 39 from the current sensor 38 to control operation of the second transistor 52 in the current limit circuit 46. According to one embodiment of the invention, the current feedback signal 39 is converted to a digital signal, either via the current sensor 38 or via an analog-to-digital (A/D) converter connected in series between the current sensor 38 and the processor 32. The processor 32 receives the digital current feedback signal and compares the value to a preset threshold which may be stored in memory either within or in communication with the processor 32. According to another embodiment of the invention, an external reference value may be provided to the processor 32 either digitally or via an analog signal which may be converted to a digital signal prior to comparison with the current feedback signal 39. According to still another embodiment of the invention, the processor 32 may be a dedicated comparator circuit which receives the current feedback signal 39 and a reference signal as analog signals and compares the two signals. In any of these embodiments, the reference signal or stored value define a threshold for a maximum current value desired at the output terminal 24. When the current present at the output terminal 24 (as indicated by the current feedback signal 39) is less than the threshold, the second output of the control circuit 30, as set by the processor 32 or comparator, is off or set to a logical zero. When the current present at the output terminal 24 is greater than the threshold, the second output 36 of the control circuit is on or set to a logical one by the processor 32 or comparator. The second output 36 from the control circuit 30 is, in turn, provided to the current limit circuit 46.

Figure 4A:
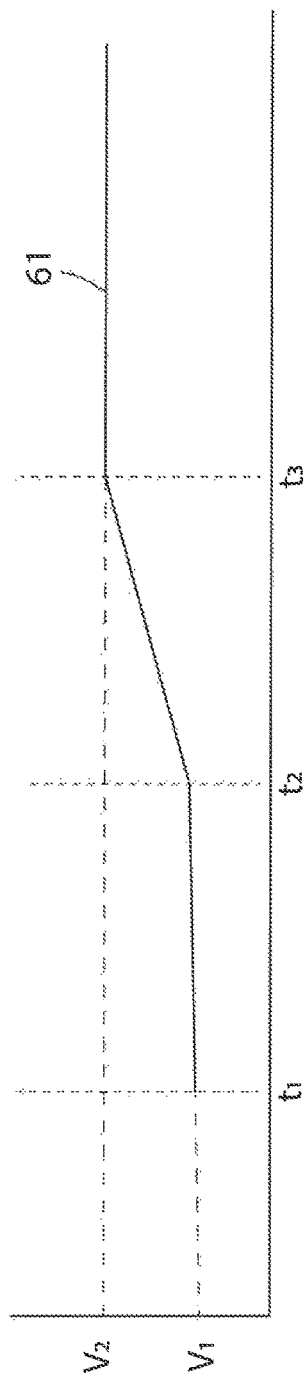
FIG. 4A is a graphical representation of the voltage measured at the output of the isolation transformer of FIG. 1 during various states of operation.
Figure 4B:
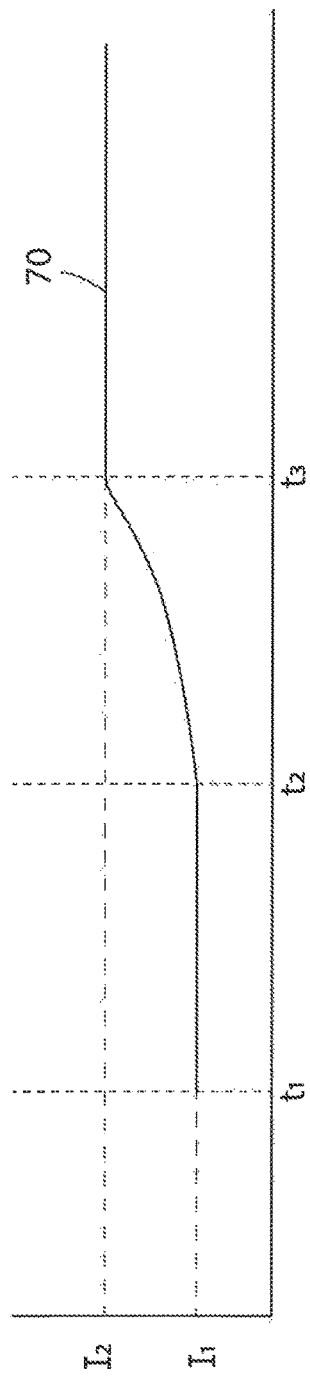
FIG. 4B is a graphical representation of the current measured at one output terminal of FIG. 1 during various states of operation.
Figure 4C:
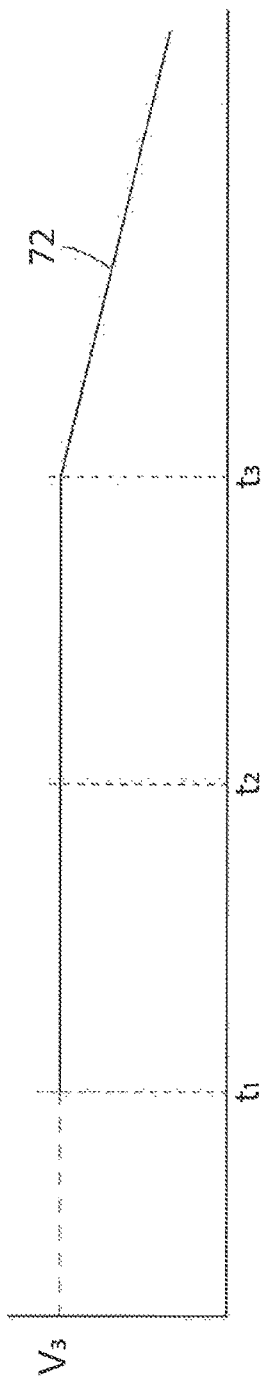
FIG. 4C is a is a graphical representation of the voltage measured at one output terminal of FIG. 1 during various states of operation.

The current limit circuit 46 uses the second output 36 to keep the current present at the output terminal 24 below a desired maximum value. A graphical representation of the operation of the current limit circuit 46 at one output terminal 24 is shown in FIGS. 4A-4C. At time $t_1$ the control signal 1 for the output terminal is set. The first output signal 34 is set either by the processor 32 or directly via the control signal 17 to enable the first transistor 50 in the current limit circuit 46. With the first transistor 50 enabled and the second transistor 52 disabled the FET 62 is enabled to operate in saturation mode. Under normal operation, illustrated between times $t_1$ and $t_2$, an input voltage 61 is drawn from the isolation transformer 26 and is present at a first voltage level, $V_1$. The output terminal 24 has an output current 70 and an output voltage 72 present at a first current level, $I_1$, and an output voltage level, $V_3$, respectively. At time $t_2$, the current 70 at the output terminal 24 begins to increase. The increase may be caused by a change in load, short circuit, or other operating or fault condition. As the current 70 increases, the input voltage 61 drawn from the isolation transformer begins to increase as well. At time, $t_3$, the output current reaches the maximum threshold. The control circuit 30 sets the second output 36 and the current limit 46 enables the second transistor 52. Enabling the second transistor 52 causes the FET 62 to operate in a linear mode. The output current 70 remains constant, but the output voltage 72 is reduced to prevent further increase in the output current. Operating the FET 62 in this manner to limit the output current 70 also prevents the input voltage 61 drawn from the isolation transformer 26 from increasing further. As a result, the isolation transformer 26 remains active and is prevented from entering a shut down mode. As a further result, the control voltage 27 supplied to the DC-to-DC converter 28 also remains present, allowing the control circuit 30 to continue operation and to maintain control over the output terminal 24.

As another aspect of the invention, an indication of the current limit condition may be provided to the industrial controller in which the output module is located. In one embodiment of the invention, the current feedback signal 39 may be provided via the system control circuit 14 to a backplane or data bus and communicated to a processor module. Optionally, the second output signal 36 may be provided to the processor module. When the processor module is alerted of the current limiting operation, it may be configured to post an alarm or fault message, to take action to remove power from the output terminal, or to take any other suitable action according to the application requirements.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. An output circuit for an output module used in an industrial controller, wherein the output module includes a plurality of output terminals, the output circuit comprising:
   a system side control circuit operative to receive a plurality of digital signals from the industrial controller, wherein each of the plurality of digital signals corresponds to a desired output signal at one of the plurality of terminals;
   for each of the plurality of output terminals, the output circuit further comprises:
   an isolation circuit having:
      an input configured to receive power from a power source, and
      an output configured to provide power electrically isolated from the power source to the corresponding output terminal;
   a terminal control circuit operative to:
      receive power from the output of the isolation circuit,
      receive the digital signal for the corresponding output terminal, and
      selectively connect the output of the isolation circuit to the corresponding output terminal;
   a switch operatively connected between the output of the isolation circuit and the corresponding output terminal to selectively connect the output of the isolation circuit to the corresponding output terminal in one of three operating states, wherein the three operating states include an off operating state, an on operating state, and a current limited operating state; and
   a current limit circuit operative to:
      output a control signal to the switch to select one of the three operating states, and
      vary a voltage of the control signal to limit a current conducted between the output of the isolation circuit and the corresponding terminal to a predefined threshold in the current limited operating state.

2. The output circuit of claim 1 further comprising a first terminal operative to receive power from an external power supply, wherein the external power supply is the power source.

3. The output circuit of claim 1 wherein the isolation circuit includes an isolation transformer, the input of the isolation circuit is connected to a primary winding of the isolation transformer, and the output of the isolation circuit is connected to a secondary winding of the isolation transformer.

4. The output circuit of claim 1, wherein the switch further comprises a transistor operatively connected between the output of the isolation circuit and the corresponding output terminal wherein the transistor is controlled by the control signal from the current limit circuit.

5. The output circuit of claim 4 wherein the current limit circuit further comprises:
   a first input from the terminal control circuit, wherein the first input corresponds to the digital signal for the corresponding output terminal;
   a first switching element selectively enabling the transistor to operate in the on operating state responsive to the first input to the current limit circuit;
   a second input from the terminal control circuit, wherein the second input corresponds to current limited operation of the transistor; and
   a second switching element selectively enabling the transistor to operate in the current limited operating state responsive to the first and second inputs to the current limit circuit.

6. The output circuit of claim 5 wherein the terminal control circuit further comprises:
   a current sense circuit operative to generate a current feedback signal corresponding to an amount of current output at the corresponding terminal;
   a processor operative to:
      receive the current feedback signal,
      receive the digital signal for the corresponding terminal from the system side control circuit,
      generate a first control signal and a second control signal responsive to the current feedback signal and the digital signal,
      output the first control signal to the first input of the current limit circuit, and
      output the second control signal to the second of the current limit circuit.

7. An output circuit for an output module used in an industrial controller, wherein the output module includes a plurality of output terminals, the output circuit comprising:
   a plurality of isolation circuits, wherein each isolation circuit corresponds to one of the plurality of output terminals and each isolation circuit is configured to receive power from a power source at an input to the isolation circuit and to provide electrically isolated power from an output of the isolation circuit to the corresponding output terminal;
   a plurality of terminal control circuits, wherein each terminal control circuit corresponds to one of the plurality of output terminals and each terminal control circuit is operative to selectively connect the electrically isolated power from the corresponding isolation circuit to the corresponding output terminal;

a plurality of switches, each switch connected between the output of one of the plurality of isolation circuits and the corresponding output terminal to selectively connect the output of the isolation circuit to the corresponding output terminal in one of three operating states, wherein the three operating states include an off operating state, an on operating state, and a current limited operating state; and a plurality of current limit circuits, wherein each current limit circuit corresponds to one of the plurality of output terminals and is operative to:
output a control signal to the corresponding switch to select one of the three operating states, and
vary a voltage of the control signal to limit a current conducted between the output of the isolation circuit and the corresponding terminal to a predefined threshold in the current limited operating state.

8. The output circuit of claim 7 further comprising a first terminal operative to receive power from an external power supply, wherein the external power supply is the power source.

9. The output circuit of claim 7 wherein each of the plurality of isolation circuits includes an isolation transformer, the input to the isolation circuit is connected to a primary winding of the isolation transformer, and the output of the isolation circuit is connected to a secondary winding of the isolation transformer.

10. The output circuit of claim 7 further comprising a plurality of digital input signals, where each digital input signal corresponds to one of the plurality of output terminals and wherein each of digital input signal defines a desired output signal of the corresponding output terminal.

11. The output circuit of claim 10 wherein each of the plurality of switches further comprises a transistor operatively connected between the output of the isolation circuit and the corresponding output terminal wherein the transistor is controlled by the control signal from the current limit circuit.

12. The output circuit of claim 11 wherein each of the plurality of current limit circuits further comprises:
a first input from the terminal control circuit, wherein the first input corresponds to the digital input signal for the corresponding output terminal;
a first switching element selectively enabling the transistor to operate in the on operating state responsive to the first input to the current limit circuit;
a second input from the terminal control circuit, wherein the second input corresponds to current limited operation of the transistor; and
a second switching element selectively enabling the transistor to operate in the current limited operating state responsive to the first and second inputs to the current limit circuit.

13. The output circuit of claim 12 wherein each of the plurality of terminal control circuits further comprises:
a current sense circuit operative to generate a current feedback signal corresponding to an amount of current output at the corresponding terminal;
a processor operative to:
receive the current feedback signal,
receive the digital input signal for the corresponding terminal,
generate a first control signal and a second control signal responsive to the current feedback signal and the digital input signal,
output the first control signal to the first input of the current limit circuit, and
output the second control signal to the second of the current limit circuit.

14. A method of limiting current in an output module used in an industrial controller, wherein the output module includes a plurality of output terminals, the method comprising the steps of:
receiving a digital input signal for each of the plurality of output terminals, wherein each digital input signal defines a desired output state of the corresponding output terminal;
receiving power from a power source at an input for a plurality of electrical isolation devices, wherein each electrical isolation device corresponds to one of the plurality of output terminals;
selectively supplying power from an output of each of the plurality of electrical isolation devices to the corresponding output terminal, wherein a switching device receives the electrically isolated power from the output of the electrical isolation device and selectively supplies the power to the corresponding output terminal in one of three operating states responsive to the corresponding digital input signal, wherein the three operating states include an off operating state, an on operating state, and a current limited operating state;
monitoring a current present at each of the plurality of output terminals in a terminal control circuit;
outputting a control signal from a current limit circuit to the switching device to select one of the three operating states, and
varying a voltage of the control signal to limit the current conducted between the output of the isolation circuit and the corresponding terminal to a predefined threshold with a current limit circuit in the current limited operating state.

15. The method of claim 14 further comprising receiving power from an external power supply at a first terminal, wherein the external power supply is the power source.

16. The method of claim 14 wherein each of the plurality of electrical isolation devices is an isolation transformer, the input for each electrical isolation device is connected to a primary winding of the isolation transformer, and the output for each electrical isolation device is connected to a secondary winding of the isolation transformer.

17. The method of claim 14 wherein the switching device is a field-effect transistor operatively connected between the output of the corresponding electrical isolation device circuit and corresponding output terminal.

18. The method of claim 17 wherein:
each current limit circuits includes a first input and a second input from the terminal control circuit,
the first input corresponds to the digital input signal for the corresponding output terminal,
the second input corresponds to current limited operation of the field-effect transistor; and
the method further comprises the steps of
selectively enabling the field-effect transistor with a first switching element to operate in the on operating state responsive to the first input to the current limit circuit; and selectively enabling the field-effect transistor with a second switching element to operate in the current limited operating state responsive to the first and second inputs to the current limit circuit.

19. The method of claim 18 further comprising the steps of:
generating a current feedback signal with a current sense circuit, the current feedback signal corresponding to an amount of current output at the corresponding terminal;
receiving the current feedback signal and the digital input signal for the corresponding terminal at a processor;
generating a first control signal and a second control signal with the processor responsive to the current feedback signal and the digital input signal,
transmitting the first control signal from the processor to the first input of the current limit circuit, and
transmitting the second control signal to the second of the current limit circuit.

\* \* \* \* \*